United States Patent [19]

Liang

[11] 4,001,868
[45] Jan. 4, 1977

[54] LATCHING DRIVER CIRCUIT AND STRUCTURE FOR A GAS PANEL DISPLAY

[75] Inventor: Robert Chao-Chuin Liang, Manassas, Va.

[73] Assignee: International Business Machines Corporation, Armonk, N.Y.

[22] Filed: Sept. 24, 1975

[21] Appl. No.: 616,477

Related U.S. Application Data

[62] Division of Ser. No. 523,773, Nov. 14, 1974.

[52] U.S. Cl. .................................. 357/46; 357/38; 357/40; 357/45; 357/48
[51] Int. Cl.² .................. H01L 29/74; H01L 27/02; H01L 27/10; H01L 27/04
[58] Field of Search .................. 357/38, 40, 45, 46, 357/48

[56] References Cited

UNITED STATES PATENTS

| | | | |
|---|---|---|---|
| 2,838,675 | 6/1958 | Wanlass | 357/40 |
| 3,440,551 | 4/1969 | Narud et al. | 357/40 |
| 3,614,474 | 10/1971 | Hahn | 357/40 |
| 3,673,431 | 6/1972 | O'Brien | 357/40 |
| 3,706,892 | 12/1972 | O'Brien | 357/40 |
| 3,737,682 | 6/1973 | Ahmed | 357/40 |
| 3,754,161 | 8/1973 | Johnson | 357/40 |
| 3,798,471 | 3/1974 | Williams | 357/40 |
| 3,808,501 | 4/1974 | Iwakawa et al. | 357/40 |

*Primary Examiner*—Edward J. Wojciechowicz
*Attorney, Agent, or Firm*—John E. Hoel

[57] ABSTRACT

The circuit and structure of a high voltage switch with latchup is disclosed for a latching driver used in a gas panel display. The driver circuit functions as a high voltage, single pole, double throw switch with memory. A plurality of the latching driver circuits may be integrated on an LSI chip. Each position lighted on a gas panel display requires two latching driver circuits which are operated in a complementary fashion by suitable logic. The latching driver circuit is comprised of a complementary transistor, high voltage output switch which is controlled by a positive feedback silicon controlled switch which serves as the latching mechanism. The structure of the latching driver is of an advanced integrated design employing a plurality of lateral complementary transistors in two isolation regions.

6 Claims, 13 Drawing Figures

FIG. 1 SYSTEM ENVIRONMENT (FIG. 2 OF USP. 3,311,124)

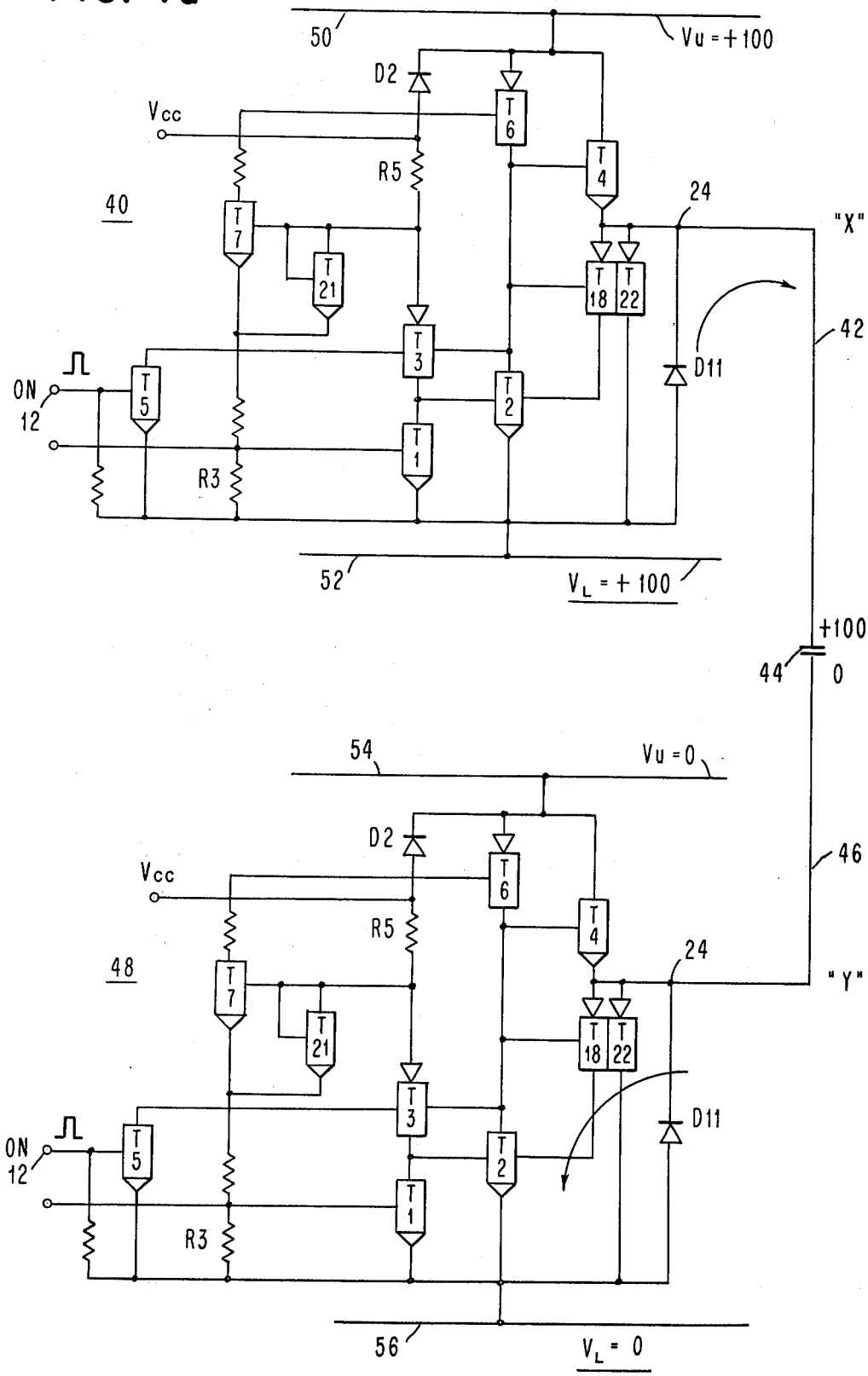
FIG. 4a  SUSTAIN MODE – FIRST HALF – PERIOD

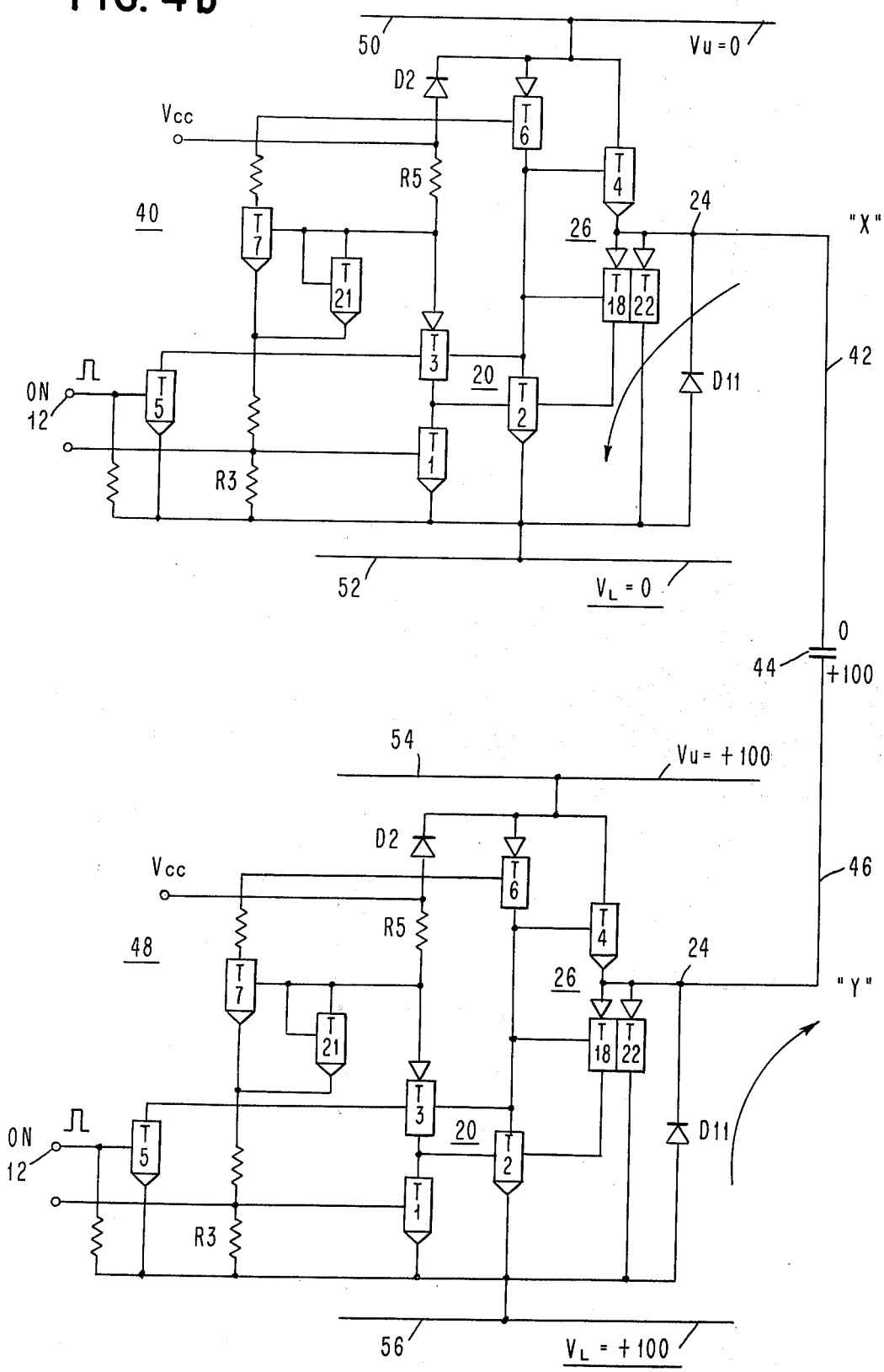
FIG. 4b  SUSTAIN MODE – SECOND HALF-PERIOD

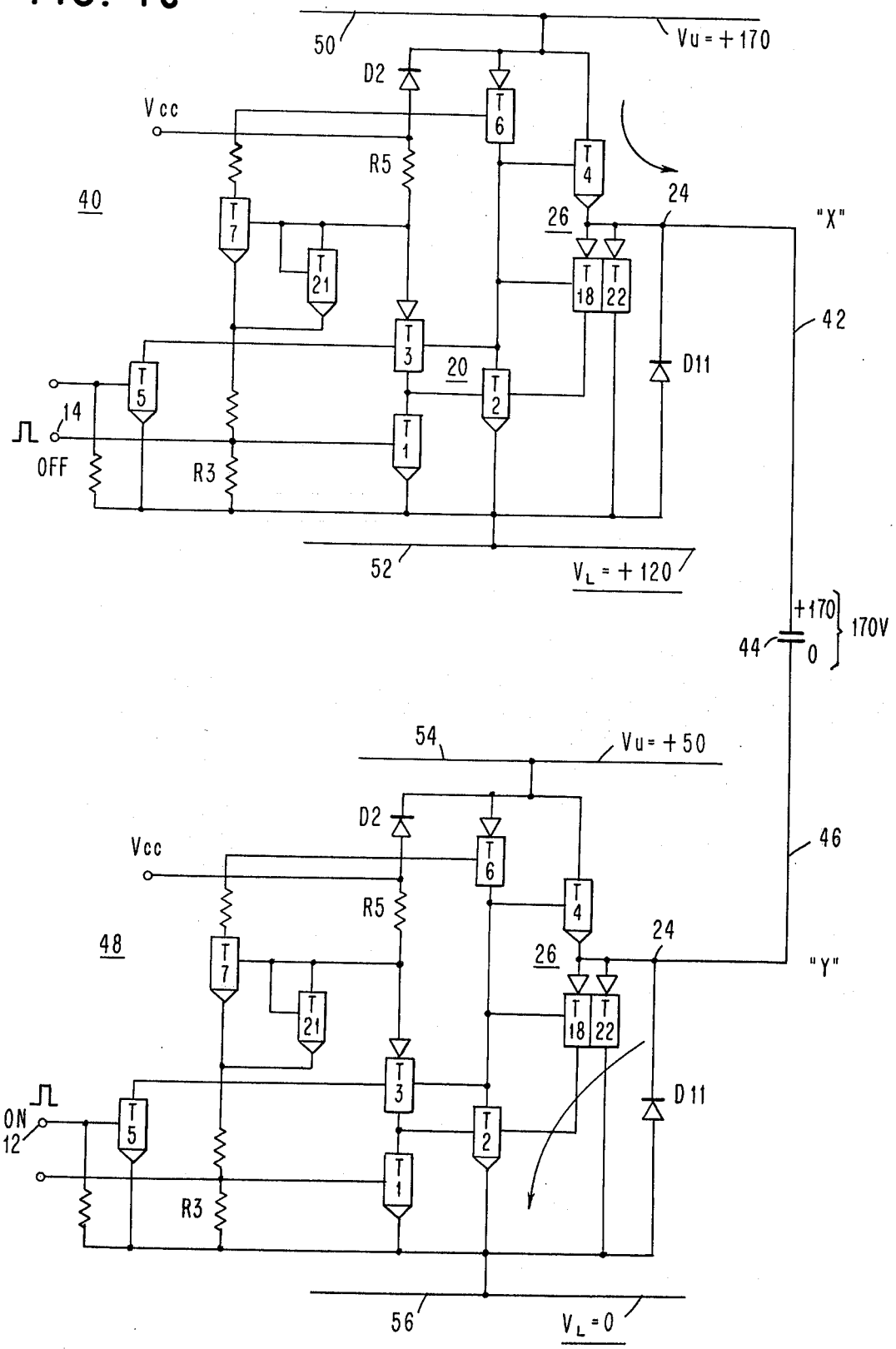
FIG. 4c WRITE OR ERASE MODE — SELECTED

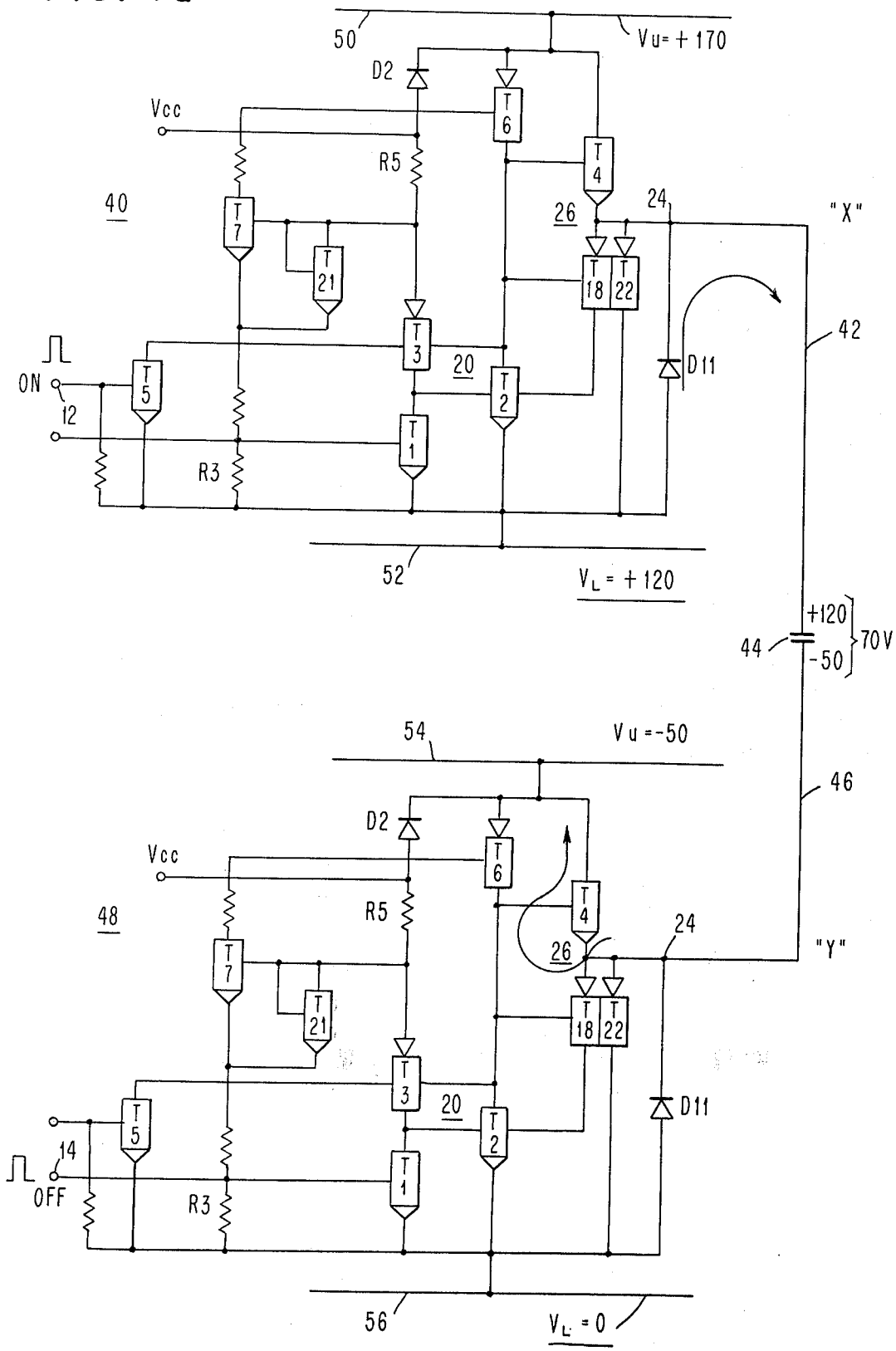
FIG. 4d  WRITE OR ERASE MODE – DESELECTED

FIG. 4e WRITE OR ERASE MODE — HALF SELECTED IN "X"
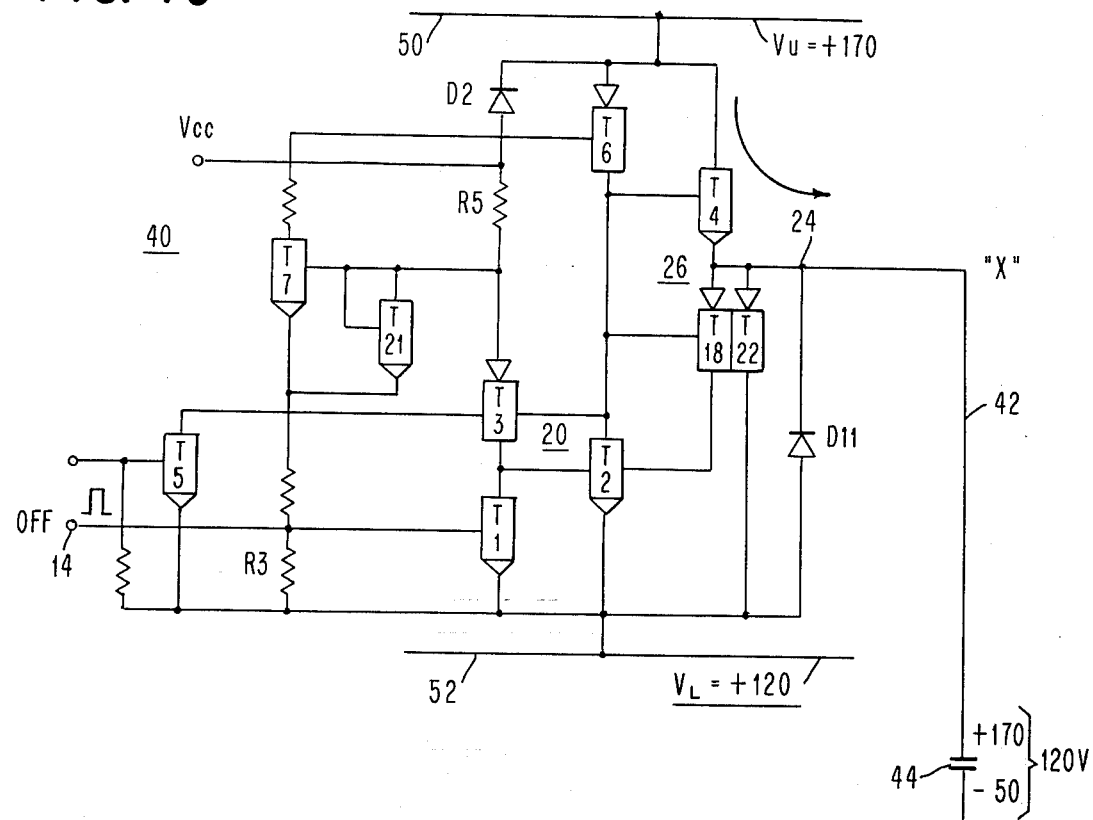
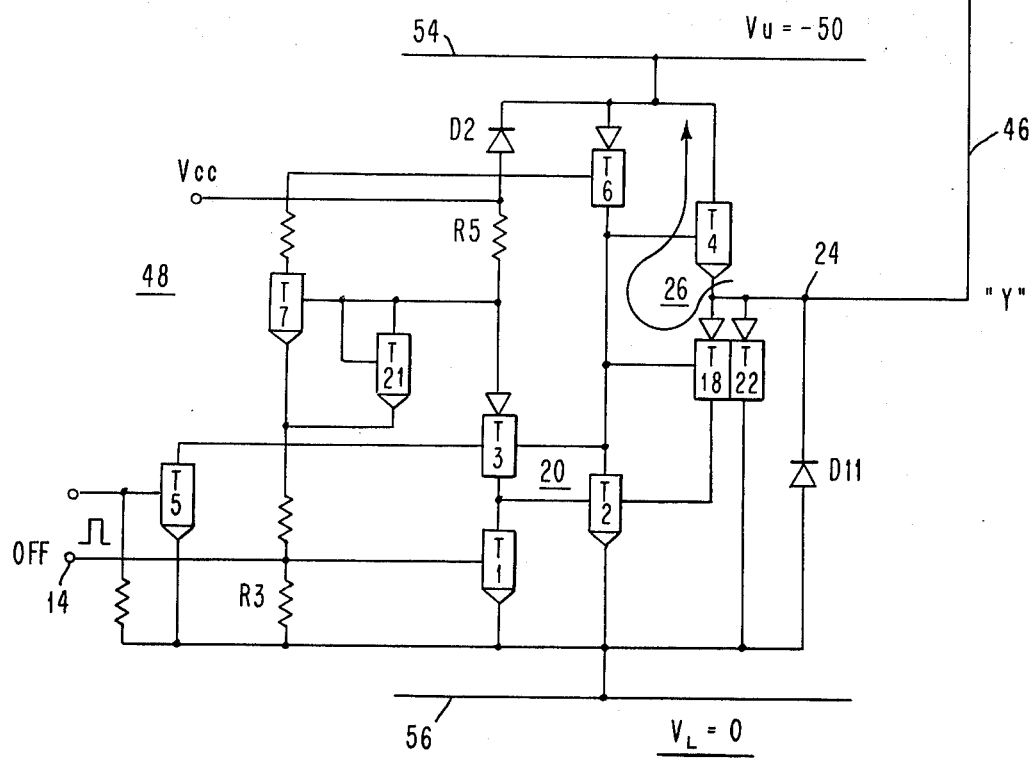

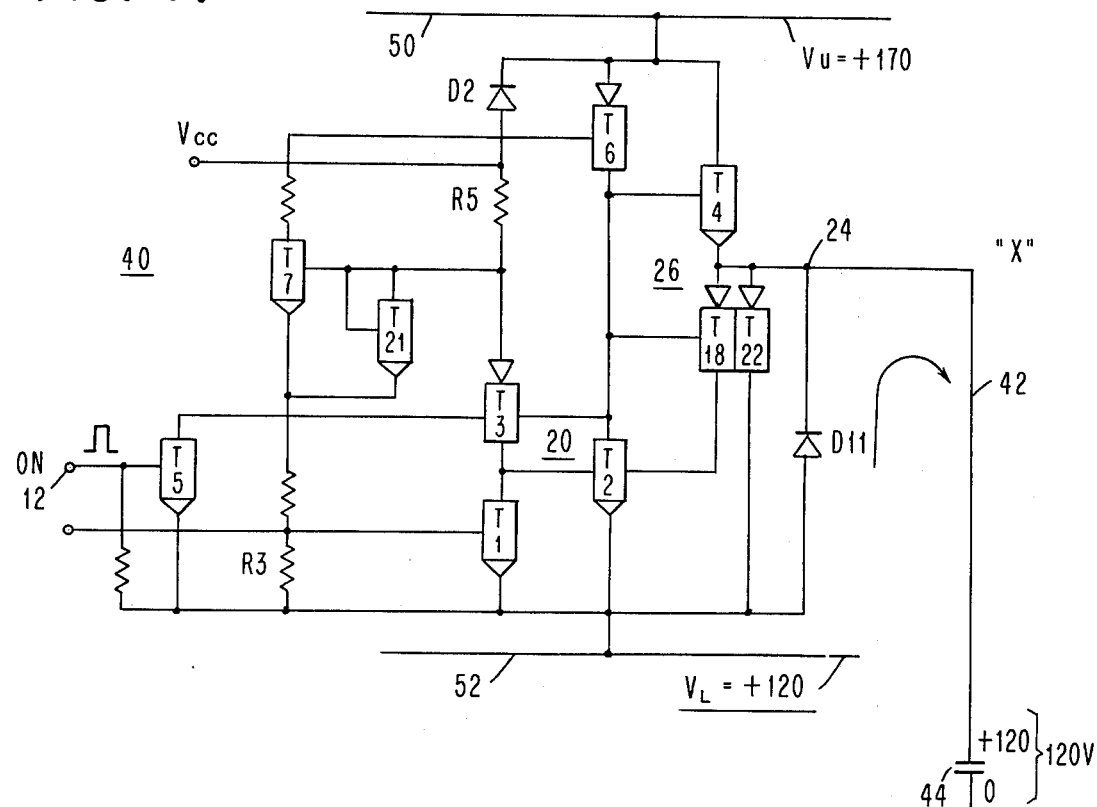
FIG. 4f  WRITE OR ERASE MODE – HALF SELECT IN "Y"

(A'A)

(B'-B)

LATCHING DRIVER CIRCUIT AND STRUCTURE FOR A GAS PANEL DISPLAY

This is a division of application Ser. No. 523,773, filed Nov. 14, 1974.

FIELD OF THE INVENTION

This invention relates to an integrated monolithic switch for high voltage applications. More particularly, the invention relates to drivers for gas panel displays.

CROSS REFERENCES TO RELATED APPLICATIONS AND PATENTS

This application concerns an improvement in the coordinate line driver circuit with latching control shown in FIG. 3 of the U.S. Pat. No. 3,811,124 to B. G. Kleen, et al which is assigned to the instant assignee. The Kleen, et al patent is entitled "Solid State Gas Panel Display Circuits With Non-Inductive Solid State Isolation Between Low Level Logic and High Level Drive Signal Functions" and discloses the system environment in which the instant invention finds its principal application.

Other related patent applications include U.S. Patent applications, Ser. No. 885,086 and 238,572 by T. N. Criscimagna, et al, filed respectively on Dec. 15, 1969 and Mar. 27, 1972; and entitled respectively, "Improved Method and Apparatus for a Gas Panel Display" and Floating Addressing System for Gas Panel," of which the Kleen, et al patent is an improvement.

BACKGROUND OF THE INVENTION

Prior art gas panel display control systems are not easily adapted to parallel selective manipulation of an entire line of discharge sites spanning one panel coordinate. Thus, since it is usually necessary to interpose at least one sustaining cycle between successive writing operations (to prevent excessive dissipation of existing polorization conditions of the gas panel), the maximum range of panel write/erase manipulation in such systems is significantly curtailed by comparison to a system having full parallel line write/erase capability. The above-mentioned Kleen, et al patent 3,811,124 solves this problem with the prior art by including a field effect transistor latch along with the high voltage driver switching circuit. This enables the rapid preconditioning of a large number of the latching FET elements selectively, one at a time (to set up selective drive switching control conditions for parallel manipulation of a full line of panel sites in one coordinate direction, row or column) during a fraction of the quiescent sustaining period preceeding each write/erase manipulation. The contribution of the Kleen, et al patent includes among other things, the association of a latching circuit with the high voltage driver to permit extremely fast preconditioning of the drivers on the order of nanoseconds, in comparison to the minimum duration of a write/erase cycle on the order of multimicroseconds, permitting the selective preconditioning of latching elements associated with an entire line of gas panel displays sites. This permits the manipulation of any part or the whole of a line of panel discharge sites in each write/erase cycle.

The invention disclosed herein, improves upon the design of a high voltage driver and latching circuit shown in FIG. 3 of the Kleen, et al patent by increasing the switching speed of the latching driver circuit while decreasing both the size of the circuit and its heat dissipation.

OBJECTS OF THE INVENTION

It is an object of the invention to increase the speed of operation of a high voltage latching driver.

It is another object of the invention to reduce the size of a high voltage latching driver.

It is still another object of the invention to reduce the heat dissipation per unit area for a high voltage latching driver.

It is still a further object of the invention to provide a high voltage latching driver for a gas panel display of an improved design.

A further object of the invention is to layout a silicon controlled switch for a latching driver in a smaller area than has been done in the prior art.

An additional object of the invention is to layout a latching driver in an integrated circuit which occupies less space than has been done in the prior art.

SUMMARY OF THE INVENTION

An improved high voltage latching driver is disclosed for use in a gas panel display. A pair of monolithic semiconductor bodies, one for each group of row conductors and column conductors in a gas discharge panel display, contain a plurality of functionally identical high voltage latching drivers. The circuit configuration for the high voltage latching driver includes a high voltage switch formed by a pair of complementary bipolar transistors with a first NPN transistor having a collector connected to a high reference potential and its emitter connected to the emitter of a first PNP transistor having its collector collected to a low reference potential. The emitter node constitutes an output node connecting to one of the panel conductors. A silicon controlled switch is connected to the base of the first NPN and the first PNP transistors of the high voltage switch to control the alternate conduction of these transistors, in response to an input control signal to the silicon controlled switch. The silicon controlled switch is operated in a positive feedback mode thereby providing a latching of the conductive state of the high voltage switch in its selected state. The associated panel conductor is thereby selectively connected to either the high reference potential or the low reference potential thus enabling the write or erase function to be performed on the gas panel sites associated therewith.

An improved structure for the latching driver is also disclosed which is of an advanced integrated design employing a plurality of lateral complementary transistors in two isolation regions. The circuit structure disclosed permits the implementation of a latching driver which has a higher switching speed, a smaller size, and a lower power dissipation, than do high voltage latching drivers disclosed in the prior art.

DESCRIPTION OF THE DRAWINGS

The foregoing and other objects, features, and advantages of the invention will be apparent from the following more particular description of the preferred embodiments of the invention, as illustrated in the accompanying drawings.

FIG. 4A is a circuit diagram showing the operation of the latching driver invention in the sustain mode for the first half period.

FIG. 4B is a circuit diagram illustrating the operation of the latching driver invention in the sustain mode for the second half period.

FIG. 4C is a circuit diagram of the operation of the latching driver in the write or erase mode when the bit is selected.

FIG. 4D is a circuit diagram of illustrating the operation of the latching driver for the write or erase mode when the panel site is deselected.

FIG. 4E is a circuit diagram illustrating the operation of the latching driver in the write or erase mode when the panel site is half selected in the X conductor.

FIG. 4F is a circuit diagram illustrating the operation of a latching driver in the write or erase mode when the panel site is half selected in the Y conductor.

DISCUSSION OF THE PREFERRED EMBODIMENT

Figure 2:
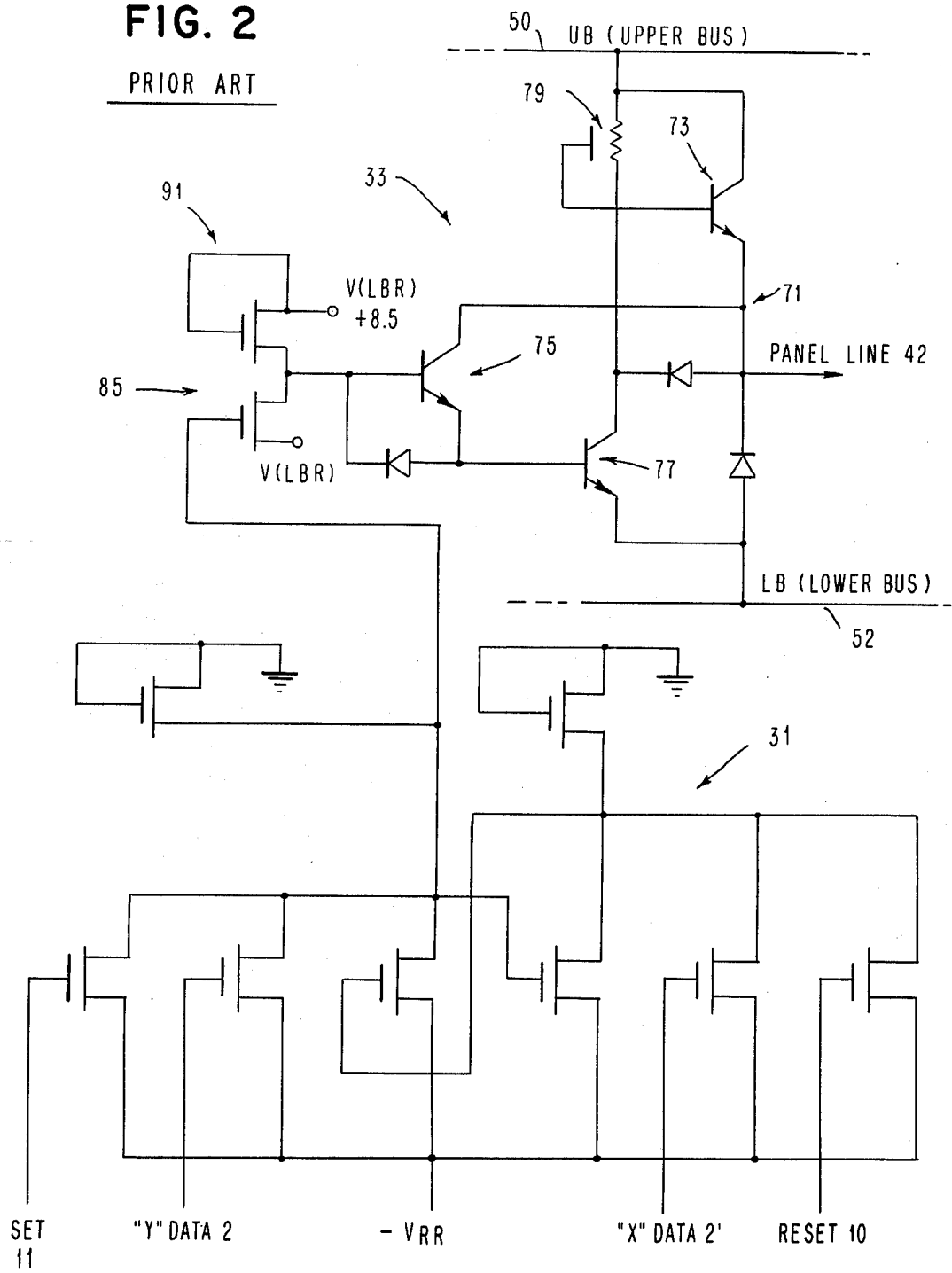
FIG. 2 is adapted from FIG. 3 of the Kleen patent and shows the prior art latching driver circuitry.
Figure 3:
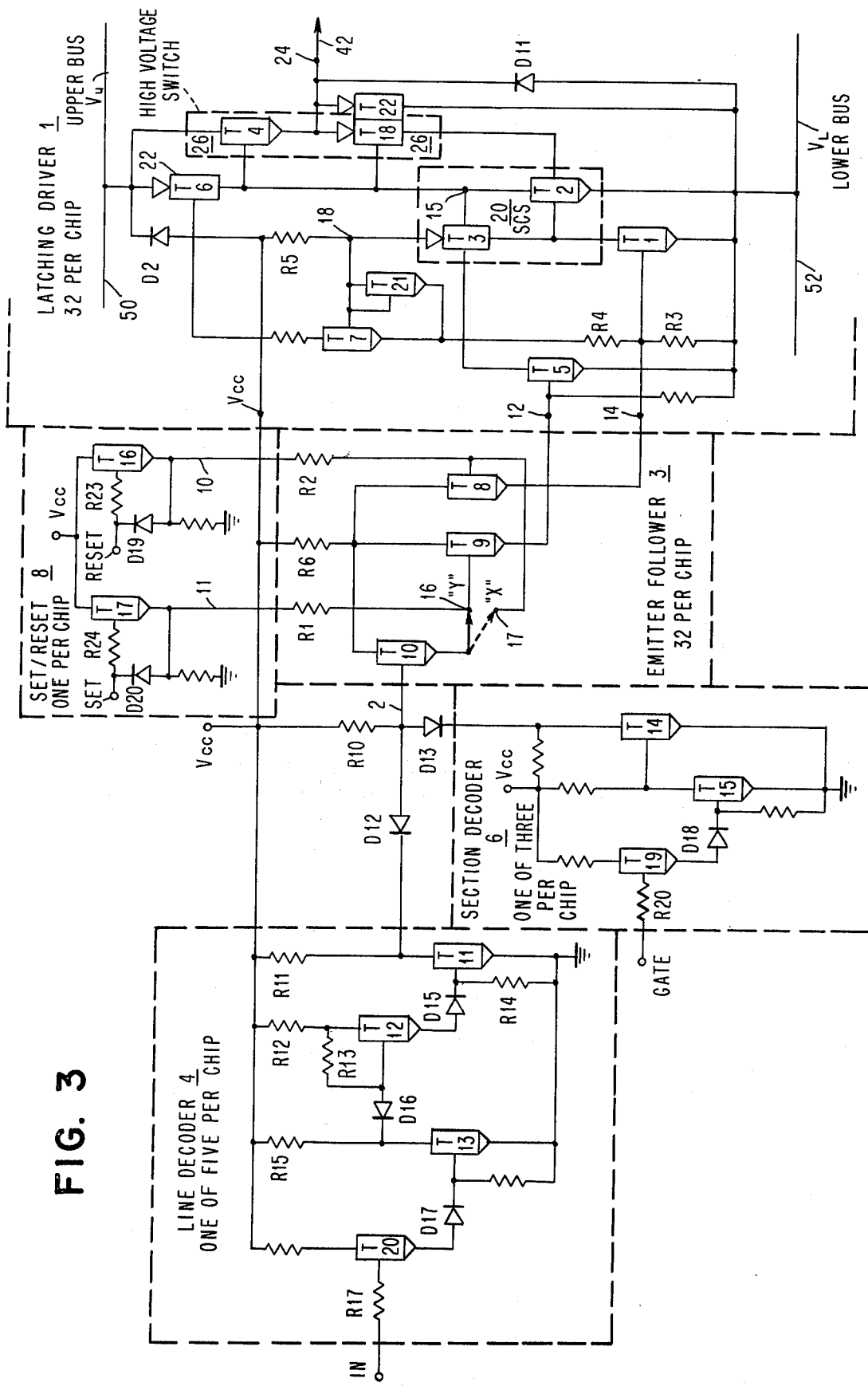
FIG. 3 is a circuit diagram of the latching driver invention.

The latching driver invention herein is an improvement of the latching driver circuit of FIG. 3 of USP 3,811,124, assigned to the instant assignee. FIG. 3 shows the circuit diagram of the latching driver invention. The conductor bus 50 of $V_U$ is the same conductor bus as the "UBR (upper bus)" of FIG. 3 of the Kleen, et al patent. The conductor bus 52 or $V_L$ in FIG. 3 is the same as the conductor "LBR (lower bus)" shown in FIG. 3 of the Kleen, et al patent. The SET line of FIG. 3 in the Kleen patent corresponds to the SET line in FIG. 3 of the instant application.. The RESET line of FIG. 3 of the Kleen patent corresponds to the RESET of FIG. 3 of the instant application. The $C_Y$ data line of FIG. 3 of the Kleen patent corresponds to the line 2 input to the base of transistor T10, with the T10 emitter connected in the "Y" configuration 16 to the base of T9, as shown in FIG. 3 of the instant application. The line $R_X$ data shown in FIG. 3 of the Kleen patent corresponds to the line 2 input to the base of the transistor T10 when transistor T10 has its emitter connected to the x position 17 to the base of transistor 18 of FIG. 3 in the instant application. Thus it is seen that the latching driver circuit shown in FIG. 3 of the instant application can be connected into the gas panel display control system shown in FIGS. 2 and 3 of the Kleen, et al patent.

It is seen that the operation of the latching driver circuit disclosed herein is similar to that disclosed by Kleen, et al, and illustrated in his table at column 6 lines 40–53 as follows:

Table I:

| | Drive Control/Latch Element Relationships | | | |
|---|---|---|---|---|
| Axis | Sustain | Write/Erase Select | ½ Select | Deselect |
| X | Set (All X) | Reset | Reset | Set | Set |
| Y | Set (All Y) | Set | Reset | Set | Reset |

Figure 1:
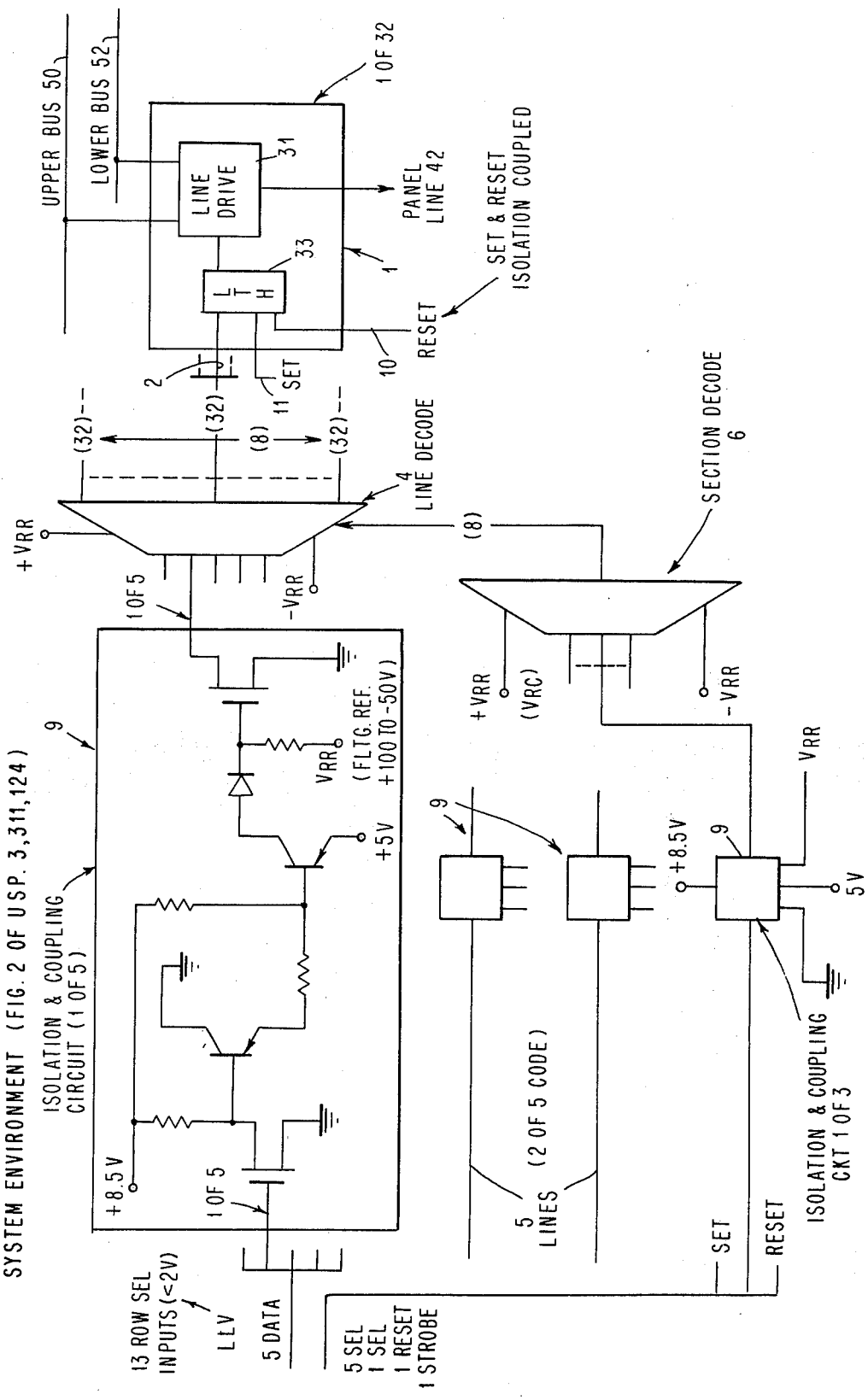
FIG. 1 is adapted from FIG. 2 of the Kleen patent and illustrates the control circuitry for the gas panel display.

FIG. 1 in the instant disclosure is an adaption of FIG. 2 of the Kleen, et al patent and illustrates the system diagram for the control for the gas panel display. One object of the instant invention is to reduce the overall size of the circuitry for the latching drivers in the gas panel display. FIG. 3 illustrates a schematic diagram of the decoding logic and latching driver circuitry which can be integrated on a single small chip. Shown in FIG. 3 is the one out of 5 of the inverter pairs 4 for the decode input for the line decoder 47 shown in the Kleen, et al patent. The diode D12 is one of the line decode diodes. The section decode inverter 6 is one out of three inverters for the section decode 43 shown in FIG. 2 of the Kleen, et al patent. The diode D13 is a section decode diode. FIG. 3 shows the SET and RESET emitter followers 8 comprising transistor T16 and transistor T17 of which there is one circuit per chip. Line 10 from the emitter of transistor T16 is output from the SET/RESET circuit 8 to the base of transistor T8. Line 11 from the emitter of transistor 17 is output from the SET/RESET circuit 8 to the base of T9. The selective connection of the emitter of T10 with either the base of T9 or the base of T8 corresponds to the use of the latching driver as a Y line driver or an X line driver, respectively. This corresponds to the Kleen, et al designation of X as the row and Y as the column conductor. Transistors T8, T9, and T10 of which there are 32 per chip, function as the on and off current drivers for the silicon controlled switch in the latching driver of FIG. 3. With a positive signal of the SET line, T9 is turned on delivering current to the terminal 12 of the latching driver. When the positive signal of the reset occurs, T8 is turned on delivering current to the terminal 14 of the latching driver. When the chip is a Y driver chip, T10 has its emitter connected to the base of T9 so that when the driver is selected, T10 is turned on and it turns on T9 delivering current to the terminal 12 of the latching driver. When the chip is an X driver chip, the emitter of T10 is connected to the base of T8 so that when the driver is selected, T10 is turning on the transistor T8 which delivers current to the terminal 14 of the latching driver.

The latching driver shown in FIG. 3 comprises a silicon controlled switch which is the combination of the PNP transistor T3 and the NPN transistor T2, where the base of the transistor T3 and the collector of transistor T2 are the same N-type diffusion and the collector of transistor T3 and the base of transistor T2 are the same P-type diffusion. Transistors T2 and T3 are connected in a positive feedback mode so that when T2 is off it tends to turn T3 off and when T2 is on it tends to turn T3 on thereby yielding a latching function. The silicon controlled switch 20 draws current from a load 22 which in the specific example shown in FIG. 3, is the PNP transistor T6. When the silicon controlled switch 20 is conducting current, the low reference potential from the bus $V_L$ turns the PNP transistor T18 on and the NPN transistor T4 off. Thus a sinking current path will be from the output node 24 through the transistor T18 and T2 to the lower bus $V_L$. A portion of the current will also be shunted through T22 to the lower bus $V_L$. When the silicon controlled switch 20 is in its off state, node 15 potential rises thereby turning PNP transistor T18 off and the NPN transistor T4 on. In this state, current from the upper bus $V_U$ will pass through transistor T4 and out through the node 24 to the panel conductor. The complementary transistor pair T4 and T18 are referred to as the complementary output switch 26 whose conductive states alternate under the control of the silicon controlled switch 20. The diode D2 is connected with its positive pole at Vcc and its negative pole connected to line 50. D2 serves to bias line 50 at voltage $V_U$ which will always be greater than the voltage $V_L$ of line 52. When The silicon controlled switch 20 is latched in its off state, this biasing effect of D2 will maintain silicon controlled switch 20 in its off state even though positive current flows into the output node 24 and into the high voltage switch 26. There need be only one diode D2 per semiconductor chip.

To illustrate the operation of the latching driver, assume the silicon controlled switch 20 is on. Current from Vcc passes through resistor R5 and feeds steadily through PNP transistor T3 to the base of T2 thereby keeping it latched on. To turn the silicon controlled switch 20 off, a positive current pulse is input to terminal 14 turning the transistor T1 on. Transistor T1 performs a base-robbing function, removing base current from the NPN transistor T2, thereby turning T2 off. As transistor T2 is turned off, the potential at node 15 rises thereby tending to turn the PNP transistor T3 off. As transistor T3 turns off, the current supply to the base of T2 is further reduced thereby positively reinforcing the unlatching operation of the silicon controlled switch comprised of T2 and T3. Simultaneously, the current feeding through the resistor R5 is diverted from the path through the PNP transistor T3 into the base of transistor T7 and the shunting diode formed by the transistor T21 connected between the base and the emitter of T7. The diverted current through the transistors T7 and T21 feeds steadily into the base of transistor T1 thereby keeping T1 on which continues to rob base current from T2, thereby maintaining the silicon controlled switch in its off state.

Continuing the description of the operation, to latch the silicon controlled switch 20 back on again, a positive pulse on the terminal 12 will turn T5 on thereby forward biasing the emitter base junction of the PNP transistor T3, turning it on. With T3 now turning on, current is supplied to the base of the NPN transistor T2 turning it on. With current flowing through transistor T2, the potential at the node 15 falls thereby reinforcing the on condition of PNP transistor T3. Thus the silicon controlled switch 20 is latched on in a positive feedback reinforcing mode. Simultaneously, the current passing through transistors T7 and T21 is diverted therefrom and back through the transistor T3 thereby supplying the base of transistor T2 with further current, insuring T2's on condition. T1, now in its off state, will remain in its off state due to the lack of a source of base current through resistor R4, since T7 and T21 are now off. The cycle may be repeated.

Thus it is seen that when a positive pulse is input on terminal 12, the output node 24 is made common with the $V_L$ bus 52. When the positive pulse is on terminal 14, the output node 24 is made common with the $V_U$ bus 50. Thus the overall function of the driver circuit is the same as that shown by Kleen, et al for the operation of the driver circuit in the gas panel display context.

The operation of the latching driver when applied to driving conductors in the gas panel display is shown in the sequence of FIGS. 4A through 4F. FIG. 4A shows the operation of the latching driver for the sustain mode in the first half. For the X coordinate, positive pulse on terminal 12 turns the silicon controlled switch 20 on thereby connecting the output node 24 to the lower voltage bus 52 at $V_L = 100$ volts. For the Y coordinate, the positive pulse on the terminal 12 of the latching driver turns the silicon controlled switch 20 on thereby connecting the output node 24 with the lower voltage bus 56 at $V_L$ equal to a potential of zero volts. In the X driver, current from the lower voltage bus 52 with $V_L$ with a voltage of 100 volts, flows through the diode D11 of the X latching driver 40, the X conductor 42, the gas panel display site 44, the Y conductor 46, and into the Y latching driver 48. Current flows in through the node 24 of the latching driver 48, through the PNP transistor T18, NPN transistor T2 and the shunt transistor T22 down to the lower voltage bus 56 having $V_L$ at zero potential. Thus it is seen that a potential of 100 volts is impressed across the gas panel display discharge site 44.

The operation of the latching driver is further illustrated in FIG. 4B where the sustain node obtains for the second half period. A positive pulse on terminal 12 of the X latching driver 40 turns the silicon controlled switch 20 on, thereby conditioning the high voltage complementary output switch 26 so as to make the output node 24 common with the lower voltage bus 52 having a potential of zero volts. Positive pulse on the input terminal 12 of the Y latching driver 48 turns the silicon controlled switch 20 on thereby conditioning the high voltage complementary output switch 26 so as to make the output node 24 common with the lower voltage bus 56 where the $V_L$ has a potential of 100 volts. Positive current flows from bus 26 through the diode D11 through the Y conductor 46, through the gas panel display site 44 through the X conductor 42 and through the node 24 of the X latching driver 40. Positive current flows through the PNP transistor T18 and T22 to the bus 52 having $V_L$ at a potential of zero volts. Thus it is seen that in the second half period of the sustain mode, a 100 volt potential is impressed across the gas panel display site 44 in a direction opposite to that which obtained during the first half period.

Further illustration on the operation of the latching driver is shown in FIG. 4C where the write or erase mode obtains and a gas panel display discharge site is selected. A positive pulse on terminal 14 turns the silicon control switch off thereby conditioning the high voltage complementary output switch 26 to make the output node 24 common with the bus 50 having $V_U$ at a potential of 170 volts. A positive pulse on terminal 12 of the Y latching driver 48 causes the silicon controlled switch to turn on thereby conditioning the high voltage output switch 26 to make the output node 24 common with the bus 56 having $V_L$ at a zero potential. Positive current from the bus 50 passes through the transistor T4 of the X latching driver 40, through the X conductor 42, the gas panel display site 44, the Y conductor 46, and through the output node 24 of the latching driver 48. Positive current passes through the transistors T18 and T22 of latching driver 48 to the bus 56, having $V_L$ at zero potential. Thus it is seen that a potential difference of 170 volts is impressed across the gas panel display site 44, igniting a discharge at that point.

A further illustration of the operation of the latching driver is shown in FIG. 4D where the write or erase mode obtains and the gas panel display site is deselected. Positive pulse on the terminal 12 of the X driver 40 turns the silicon controlled switch 20 on thereby conditioning the high voltage complementary output switch 26 to make the output node 24 common with the bus 52, with $V_L$ at 120 volts. A pulse on terminal 14 of the Y latching driver 48 turns the silicon controlled switch 20 off thereby conditioning the high voltage complementary output switch 26 to make the output node 24 common with the bus 54, having $V_U$ at a potential of 50 volts. Positive current from the bus 52 passes through diode D11 of the latching driver 40, the X conductor 42, the gas panel display site 44, the Y conductor 46, and through the output node 24 of the latching driver 48. Positive current passes through the emitter and out of the base of the transistor 18 and into the base and through the collector of transistor T4 and into the bus 54. Thus it is seen that a potential difference of only 70 volts is impressed across the gas panel display site 44. This potential is not sufficient to ignite a discharge at that point.

A further illustration of the operation of the latching driver is shown in FIG. 4E where the write or erase mode obtains and the gas panel display site is half selected in X. The X latching driver 40 has a positive pulse input on terminal 14 which turns off the silicon controlled switch 20 thereby conditioning the high voltage complementary output switch 26 to make the output node 24 common with the bus 50 having $V_U$ at a potential of +170 volts. The Y latching driver 48 has a positive input pulse on terminal 14 which turns the silicon controlled switch off thereby conditioning the high voltage output switch 26 to make the output node 24 common with the bus 54 having $V_U$ at a potential of 50 volts. Thus a positive current flows from the bus 50 through transistor T4 of the X latching driver 40, onto the X conductor 42, the gas panel display site 44, the Y conductor 46, and through the output node 24 of the Y latching driver 48. Positive current flows through the emitter and base of transistor T4 to the bus 54. Thus it is seen that a voltage of 120 volts is impressed across the gas panel display site 44. Such voltage is not sufficient to alter the discharge condition of the half-selected panel site 44.

A further illustration of the operation of the latching driver is shown in FIG. 4F where the write or erase mode obtains and the gas panel display site is half selected in Y. The X latching driver 40 has a positive pulse on the input terminal 12 which turns the silicon controlled switch 20 on thereby conditioning the high voltage complementary output switch 26 so that the output node 24 is connected to the bus 52 having $V_L$ at a voltage of 120 volts. The Y latching driver 48 has a positive input pulse on terminal 12 which turns the silicon controlled switch on thereby conditioning the high voltage complementary output switch 26 so that the output terminal 24 is common with the bus 56 having $V_L$ at a voltage of zero volts. Thus a positive current flows from the bus 52 through the diode D11 of the X driver 40, the X conductor 42, the gas panel display site 44, the Y conductor 46, and through the node 24 of the Y latching decoder 48. Positive current flows through transistors T18 and T22 to the bus 56. Thus it is seen that a voltage of 120 volts is impressed across the gas panel display site 44. The potential is not sufficient to change the discharge state of the site 44 which is half selected in Y.

SEMICONDUCTOR STRUCTURE FOR THE LATCHING DRIVER INVENTION

Figure 5A:
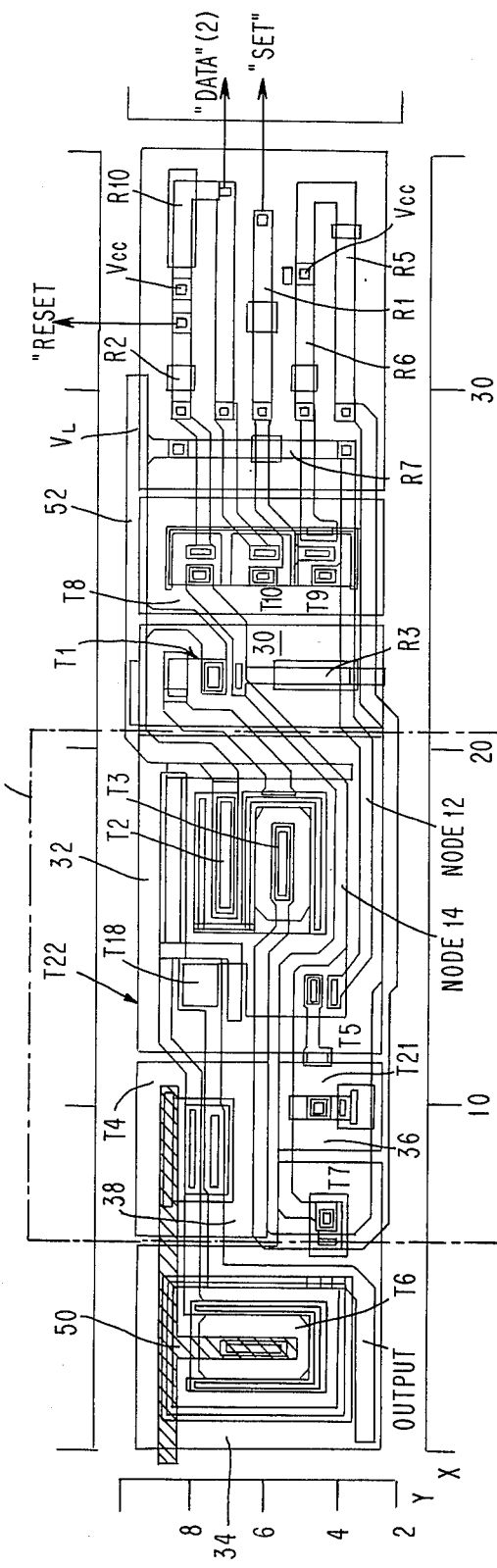
FIG. 5A is a diagram of the layout of the integrated circuit structure for the latching driver invention.
Figure 5B:
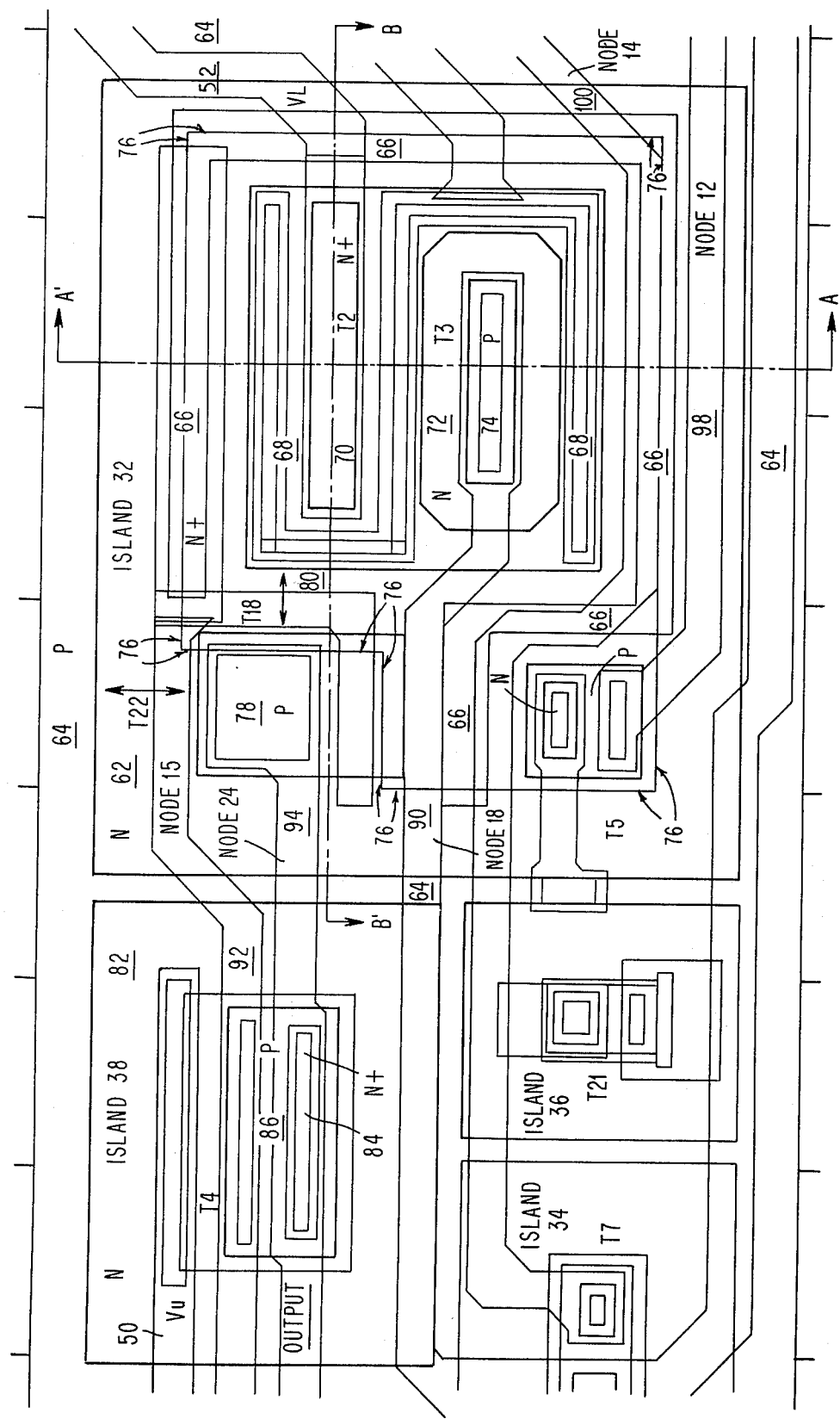
FIG. 5B is a detailed diagram of the layout of the silicon controlled switch structure for the latching driver shown in FIG. 5A.

FIG. 5A illustrates the layout of the latching driver invention 1 shown in FIG. 3. FIG. 5B shows the silicon controlled switch 20 contained within the layout of the latching driver of FIG. 5A. Cross sectional views of the structure along the line A—A' is shown in FIG. 6A and along the line BB' shown in FIG. 6B.

Figure 6A:
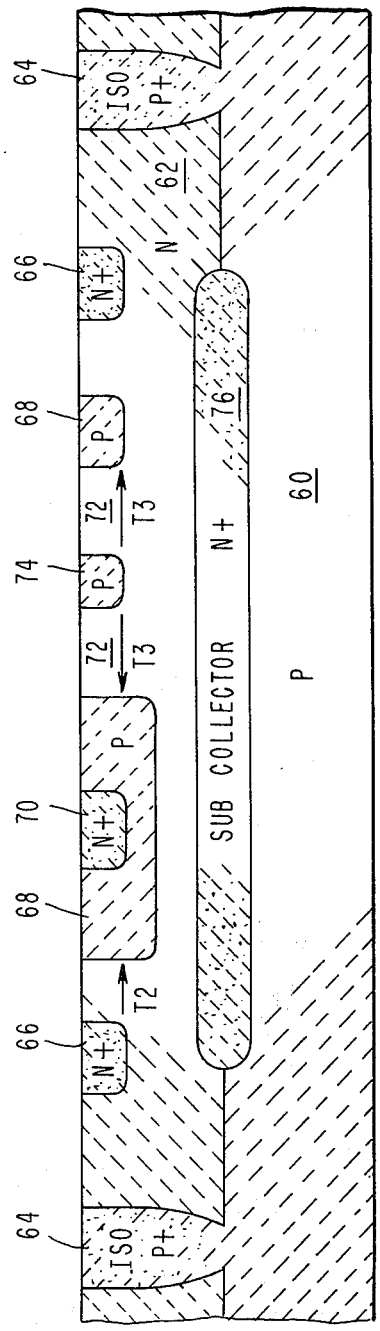
FIG. 6A is a cut-away view of the silicon controlled switch along line A—A' in FIG. 5B, showing the lateral transistor structure.
Figure 6B:
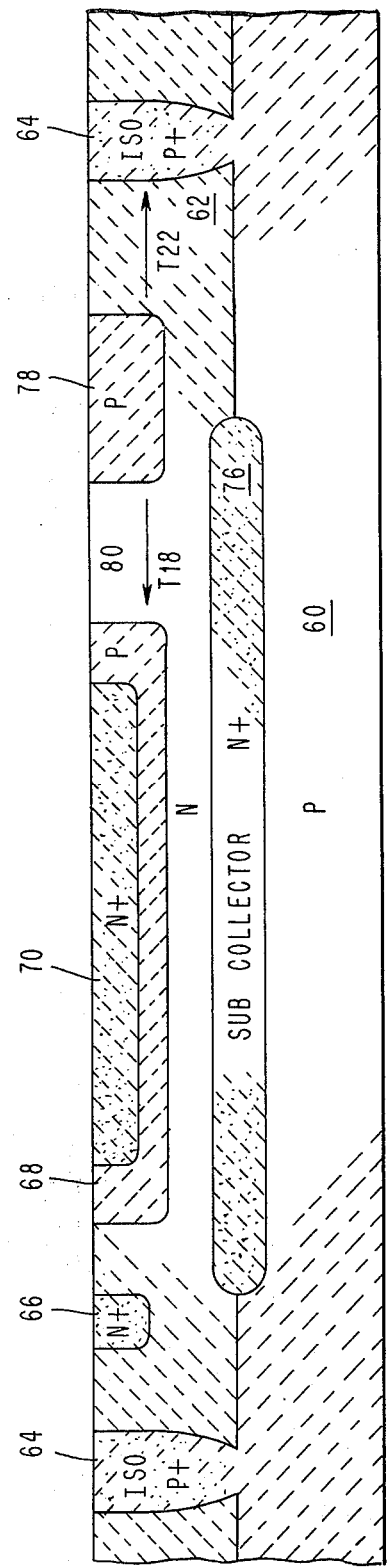
FIG. 6B is a cut-away view of the silicon controlled switch along line B—B' in FIG. 5B.

The latching driver structure is formed on a silicon P type semiconductor wafer 60, a cross sectional view of which is shown in FIG. 6A. On the surface of P type wafer 60, N+ subcollector region 76 is diffused. Subsequently, an N type epitaxial layer 62 is grown on top of the wafer surface 60. The P + isolation region 64 is then diffused into the N type epitaxial layer 62 so as to make contact with the P type substrate wafer 60, thereby forming isolation islands such as 62 and 82 shown in FIG. 5B. Then a P-type diffusion and an N-type diffusion are executed to form the lateral transistor structors which will now be described.

As previously discussed, the latching driver invention is comprised of the silicon controlled switch 20 and the high voltage switch 26. The silicon controlled switch is formed within the isolation island 62 by means of the P-type diffusion 68, the N+ diffusion 70, the P-type diffusion 74, and the epitaxial region 70 encompassed within the P type diffusion 68. A cross sectional view of the silicon controlled switch 20 is shown in FIG. 6A where the N+ region 66 functions as the collector for transistor T2, the P region 68 functions as the base of the transistor T2 and the collector of transistor T3, and the N+ region 70 functions as the emitter of T2. The region 72 of the N type epitaxial layer 62 functions as the base of T3 and the P diffusion 74 functions as the emitter of T3. In operation, positive current from node 18 flows into the emitter region 74 of the transistor T3 and flows through the region 72 of the epitaxial layer 62 which operates as a base, and into the P type region 68 operating as the collector of T3. Since region 68 also serves as the base for T2, T3 effectively supplies base current to T2. The N+ diffusion 70 serving as the emitter of T2 injects the electrons into the P type base region 68 for transistor T2, which are then collected by means of the N+ region 66, by way of the lower resistance path formed by the subcollector 76. This layout configuration for the silicon controlled switch 20 presents a more compact configuration than those found in the prior art. The metallization 90 serves as the nodal point 18 and connects to the emitter diffusion 74 of the transistor T3. The metallization 92 serves as the nodall point 15 and connects with the N+ diffusion 66 which serves as a collector for T2 and a guard ring for the silicon controlled switch.

Transistor T18 constitutes the PNP component of the high voltage switch 26 for the latching driver 1 shown in FIG. 3. Transistor T18 is formed in the region outside of the subcollector area 76 and is comprised of the P type diffusion 78 which serves as the emitter of transistor T18 and transistor T22 as well as the output node 24 for the latching driver device. The epitaxial layer 62 in the region beneath the P type diffusion 78 and in the region between the P type diffusion 78 and the isolation diffusion 64, serves as the base region for the transistor T22. The region 80 of the epitaxial layer 62 lying between the P type diffusion 78 and the P type diffusion 68 serves as the base region for the transistor T18. The potential of the N type epitaxial region 62 is governed by the conductive state of the silicon controlled switch 20 since the N+ type diffusion 66 and the N type epitaxial layer 62 serves as the collector of T2 and the base of T3. It is the potential at which this epitaxial layer 62 rests which governs the conductivity of the transistor T18 since epitaxial layer 62 also serves as the base region for transistor T18. Thus when the potential of the epitaxial layer 62 is low, the transistor T18 formed by the emitter region 78, the base region 80 of epitaxial layer 62, and the collector region 68, will be forward biased thereby connecting the output node 24 with the potential of the collector region 68 for transistor T18. The epitaxial layer 62 was initially driven to its lower potential by means of input to the base of transistor T3, which is structurally the region 72 of the epitaxial layer 62. Since T3 is conducting, the base-emitter junction in T2 is forward biased thereby making the potential of the collector region 68 the same as the potential of the emitter region 70 and T2. Thus the high voltage switch 26 presents a closed conductive path between the output node 24 and the lower bus 52.

Transistor T22 serves as a current shunting path from the output node T4 to the bus 52. Transistor T22 is formed in the isolation island 62 between the P type emitter diffusion 78, the regions of the epitaxial layer 62 beneath diffusion 78 and between diffusions 78 and the P+ isolation region 64. Positive current is injected from the P type region 78 into the N type epitaxial layer 62 when the pn junction is forward biased by the potential of the epitaxial layer which serves as the base region. Current is collected by the P type wafer substrate 60 constituting a vertical transistor configuration and is collected by the P+ isolation region 64 as a lateral transistor configuration. Since T18 and T22 share the epitaxial layer 62 as a common base region, transistor T22 turns on when transistor T18 turns on, thereby performing a current shunting function around the transistor 18. Metallization 94 constitutes the node 24 and connects with the emitter diffusion 78 for the transistors T18 and T22. The potential of the emitter region 78 is transferred through node 24 to the output line 42 as the output potential for the latching driver 1 of FIG. 3.

The transistor T4 which, along with transistor T18, constitutes the high voltage switch 26 of the latching driver 1 of FIG. 3, is formed in the isolation island 82 shown in FIG. 5b. The transistor T4 is formed in the epitaxial layer 82 by means of a P type base diffusion 86 and N+ type emitter diffusion 84. The N-type epitaxial layer 82 which serves as the collector of transistor T4, is connected by means of metallization 50 to the relatively high reference potential Vu. The metallization 94 which constitutes the node 24, makes contact with the emitter diffusion 84 of the transistor T4 as shown in FIG. 5B. The metallization 92 which constitutes node 15, is connected to the collector diffusion 66 of transistor T2 and thus has the potential of the epitaxial layer 62 in the isolation island 62. This potential is carried by the metallization 92 to the base diffusion 86 for the transistor T4. Thus since transistor T4 is an NPN and the transistor T18 is a PNP, when the potential of metallization 92 and epitaxial layer 62 is relatively high, the NPN transistor T4 is on and the PNP transistor T18 is off, connecting output node 24 to the higher potential Vu on metallization 50. Conversely, when the relative potential of the metallization 92 and the epitaxial layer 62 is low, the PNP transistor T18 is on and the NPN transistor T4 is off, connecting output node 24 to the lower potential V2 on metallization 52. Thus the function of the high voltage switch 26 is performed by the structure in which the transistors T4 and T18 are embodied in FIG. 5B. Thus the output node 24 can alternately be connected to the relatively high potential of the collector of transistor T4 or the relatively low potential of the collector of transistor T18 under the control of the silicon controlled switch 20. The potential of the output node serves as the drive potential output on line 42 for utilization in a gas panel display.

The layout for the latching driver shown in FIG. 5A shows the transistor T1 laid out in isolation island 30, transistors T2, T3, T5, T18, and T22 laid out in isolation island 32, transistor T6 and T7 laid out in isolation island 34, transistor T21 laid out in isolation island 36, and transistor T4 laid out in isolation island 38. Input node 12 is shown as the metallization 98 which is input to the base of transistor T5 in isolation island 32. Input node 14 shown as metallization 100 is connected to the base region of transistor T1 in the isolation island 30. Metallization 50 is the upper bus and is connected to the collector of transistor T4 in isolation island 38. The lower bus 52 shown as the metallization 52 and is connected to the emitter of T2 in isolation island 32.

Thus it is seen that the improved lateral transistor structure of which the silicon controlled switch and the high voltage switch are comprised, constitutes a more compact configuration generating a lower power dissipation in its off state then prior art latching driver structures. The structure of the latching driver circuit shown in FIG. 5A with its shunting transistor T22, provides a lower resistance path between the output node 24 and the lower bus 52 that has been achieved in the prior art.

While the invention has been particularly shown and described with reference to the preferred embodiments thereof, it will be understood by those skilled in the art that the foregoing and other changes in form and detail may be made therein without departing from the spirit and the scope of the invention.

I claim:
1. A latching, high voltage driver integrated circuit structure, comprising:
A first P type semiconductor substrate;
An N type epitaxial layer formed on the surface of said substrate;
An isolation region formed in said epitaxial layer so as to enclose a first area of said epitaxial layer;
said first area of said epitaxial layer being connected to a first control signal source;
A first P type region within said first area of said epitaxial layer, having an open configuration enclosing a second area of said epitaxial layer within said first area and switchably connected to a low voltage source in response to a second control signal;
A second P type region within said second area of said epitaxial layer, having a connection to a positive current source;
An N type region within said first P type region connected to said low voltage source;
A third P type region within said first area of said epitaxial layer and connected to an output node;

Said epitaxial layer forming the collector of a first NPN transistor having said first P type region as its base and said N type region as its emitter;

Said epitaxial layer forming the base of a first PNP transistor having said first P type region as its collector and said second P type region as its emitter;

Said first NPN transistor and said first PNP transistor forming a silicon controlled switch device;

Said epitaxial layer forming the base of a second PNP transistor having said first P type region as its collector and said third P type region as its emitter;

A second NPN transistor formed in said epitaxial layer outside said isolation region, with its emitter connected to said third P type region, its base connected to said epitaxial layer within said isolation region, and its collector connected to a high voltage source;

Said second NPN transistor and said PNP transistor forming a high voltage switch for alternately connecting said output node to said high voltage source or to said low voltage source;

Whereby said first control signal will cause said silicon controlled switch to latch on thereby causing said high voltage switch to connect said low voltage source to said output node and said second control signal will cause said silicon controlled switch to latch off thereby causing said high voltage switch to connect said high voltage source to said output node.

2. The latching high voltage driver integrated circuit structure of claim 1 which further comprises:

Said isolation region being composed of a P type material and being connected to said low voltage source;

Said first area of said epitaxial layer within said isolation region forming the base of a third PNP transistor having said third P type region as its emitter and said isolation region as its collector;

Whereby said third PNP transistor constitutes a current shunt between said output node and said low voltage source, which is responsive to the conductive state of said silicon controlled switch.

3. The latching, high voltage driver integrated circuit structure of claim 1, which further comprises:

A fourth P type region within said first area of said epitaxial layer, connected to said first control signal source;

A second N type region within said fourth P type region, connected to said low voltage source and forming the emitter of a third NPN transistor having said fourth P type region as its base and said first area of said epitaxial layer within said isolation region as its collector;

Whereby said first control signal renders said third NPN transistor conductive thereby forward biasing the emitter base junction of said first PNP transistor, thereby serving as a switching means for initiating the conductive state of said silicon controlled switch.

4. In an electrical circuit system for supplying sustaining voltages and discharges controlling pulse voltages to one group of row conductors and one group of column conductors in a gas discharge panel device to enter and remove information on said panel, at least a pair of monolithic semiconductor bodies, one for each said group of conductors and each including a plurality of functionally identical high voltage transistor switching circuits having an integrated circuit structure comprising:

A first P type semiconductor substrate;

An N type epitaxial layer formed on the surface of said substrate;

An isolation region formed in said epitaxial layer so as to enclose a first area of said epitaxial layer;

Said first area of said epitaxial layer being connected to a first control signal source;

A first P type region within said first area of said epitaxial layer, having an open configuration enclosing a second area of said epitaxial layer within said first area and switchably connected to a low voltage source in response to a second control signal;

A second P type region within said second area of said epitaxial layer, having a connection to a positive current source;

An N type region within said first P type region connected to said low voltage source;

A third P type region within said first area of said epitaxial layer and connected to one of said conductors as an output node;

Said epitaxial layer forming the collector of a first NPN transistor having said first P type region as its base and said N type region as its emitter;

Said epitaxial layer forming the base of a first PNP transistor having said first P type region as its collector and said second P type region as its emitter;

Said first NPN transistor and said first PNP transistor forming a silicon controlled switch device;

Said epitaxial layer forming the base of a second PNP transistor having said first P type region as its collector and said third P type region as its emitter;

a second NPN transistor formed in said epitaxial layer outside said isolation region, with its emitter connected to said third P type region, its base connected to said epitaxial layer within said isolation region, and its collector connected to a high voltage source;

Said second NPN transistor and said PNP transistor forming a high voltage switch for alternately connecting said output node to said high voltage source or to said low voltage source;

Whereby said first control signal will cause said silicon controlled switch to latch on thereby causing said high voltage switch to connect said low voltage source to said one of said conductors and said second control signal will cause said silicon controlled switch to latch off thereby causing said high voltage switch to connect said high voltage source to said one of said conductors.

5. In an electrical circuit system, the integrated circuit structure of claim 4 which further comprises:

Said isolation region being composed of a P type material and being connected to said low voltage source;

Said first area of said epitaxial layer within said isolation region forming the base of a third PNP transistor having said third P type region as its emitter and said isolation region as its collector;

Whereby said third PNP transistor constitutes a current shunt between said one of said conductors and said low voltage source, which is responsive to the conductive state of said silicon controlled switch.

6. In an electrical circuit system, the integrated circuit structure of claimm 4 which further comprises:

A fourth P type region within said first area of said epitaxial layer, connected to said first control signal source;

A second N type region within said fourth P type region, connected to said low voltage source and forming the emitter of a third NPN transistor having said fourth P type region as its base and said first area of said epitaxial layer within said isolation region as its collector;

Whereby said first control signal renders said third NPN transistor conductive thereby forward biasing the emitter base junction of said first PNP transistor, thereby serving as a switching means for initiating the conductive state of said silicon controlled switch.

* * * * *